US009807712B2

United States Patent
Ly-Gagnon et al.

(10) Patent No.: US 9,807,712 B2
(45) Date of Patent: Oct. 31, 2017

(54) SYSTEMS AND METHODS FOR BLOCKER MARGIN SIZING BY AN AUTOMATIC GAIN CONTROL

(71) Applicant: QUALCOMM Incorporated, San Diego, CA (US)

(72) Inventors: Yann Ly-Gagnon, San Francisco, CA (US); Le Nguyen Luong, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 14/944,578

(22) Filed: Nov. 18, 2015

(65) Prior Publication Data

US 2017/0142671 A1    May 18, 2017

(51) Int. Cl.
| | | |
|---|---|---|
| H04L 27/08 | (2006.01) | |
| H04W 52/52 | (2009.01) | |
| H04B 17/20 | (2015.01) | |
| H03G 3/30 | (2006.01) | |
| H04B 1/16 | (2006.01) | |

(52) U.S. Cl.
CPC .......... *H04W 52/52* (2013.01); *H03G 3/3036* (2013.01); *H03G 3/3084* (2013.01); *H04B 1/16* (2013.01); *H04B 17/20* (2015.01)

(58) Field of Classification Search
CPC . H03G 3/3052; H03G 3/3068; H04L 27/3809
USPC ................ 375/345, 350; 341/139, 143, 152; 455/240.1, 254
See application file for complete search history.

(56) References Cited

U.S. PATENT DOCUMENTS

| | | | |
|---|---|---|---|
| 7,353,010 B1 | 4/2008 | Zhang et al. | |
| 7,653,368 B2 | 1/2010 | Ashkenazi | |
| 7,929,650 B2 | 4/2011 | Sobchak et al. | |
| 8,565,358 B2 | 10/2013 | Komaili et al. | |
| 9,313,079 B2 * | 4/2016 | Komaili | H04L 27/3809 |
| 2007/0076827 A1 * | 4/2007 | Beamish | H04L 27/3809 375/345 |
| 2009/0061809 A1 | 3/2009 | Muhammad et al. | |

(Continued)

FOREIGN PATENT DOCUMENTS

| | | |
|---|---|---|
| EP | 2903165 A1 | 8/2015 |
| WO | 2013128229 A1 | 9/2013 |

OTHER PUBLICATIONS

Lin L., et al., "A Fully Integrated 2×2 MIMO Dual-Band Dual-Mode Direct-Conversion CMOS Transceiver for WiMAX/WLAN Applications," IEEE International Solid-State Circuits Conference, ISSCC 2009 / Session 24 / Wireless Connectivity / 24.5, 2009, pp. 416-417.

(Continued)

*Primary Examiner* — Khai Tran
(74) *Attorney, Agent, or Firm* — Austin Rapp

(57) ABSTRACT

A method for dynamic sizing of a blocker margin by a receiver automatic gain control (AGC) is described. The method includes measuring a wanted signal level and a blocker signal level. The method also includes adjusting a linear target for the wanted signal level at the output of an analog-to-digital converter (ADC) of the receiver based on the blocker signal level. The linear target is adjusted to optimize a wanted signal signal-to-noise ratio (SNR) and the blocker margin. The method further includes adjusting a receiver front-end gain based on the adjusted linear target.

26 Claims, 8 Drawing Sheets

(56) References Cited

U.S. PATENT DOCUMENTS

2009/0079611 A1* 3/2009 Hwang ............... H03M 1/18
341/155
2009/0247106 A1* 10/2009 Da Graca ............ H04B 1/1036
455/240.1

OTHER PUBLICATIONS

Kim H., et al., "Adaptive Blocker Rejection Continuous-Time ADC for Mobile WiMAX Applications", IEEE Journal of Solid-State Circuits, IEEE Service Center, Piscataway NJ, USA, vol. 44, No. 10, Oct. 1, 2009 (Oct. 1, 2009), pp. 2766-2779, XP011276917.
Partial International Search Report—PCT/US2016/055512—ISA/EPO—dated Jan. 24, 2017.
International Search Report and Written Opinion—PCT/US2016/055512—ISA/EPO—dated Apr. 18, 2017.

* cited by examiner

SYSTEMS AND METHODS FOR BLOCKER MARGIN SIZING BY AN AUTOMATIC GAIN CONTROL

TECHNICAL FIELD

The present disclosure relates generally to wireless communications. More specifically, the present disclosure relates to dynamic sizing of a blocker margin by a receiver automatic gain control (AGC).

BACKGROUND

In the last several decades, the use of electronic devices has become common. In particular, advances in electronic technology have reduced the cost of increasingly complex and useful electronic devices. Cost reduction and consumer demand have proliferated the use of electronic devices such that they are practically ubiquitous in modern society. As the use of electronic devices has expanded, so has the demand for new and improved features of electronic devices. More specifically, electronic devices that perform functions faster, more efficiently or with higher quality are often sought after.

Some electronic devices communicate with other electronic devices. These electronic devices may transmit and/or receive electromagnetic signals. For example, a smartphone may transmit signals to and/or receive signals from another device (e.g., a laptop computer, an electronics console in a vehicle, a wireless headset, etc.). In another example, a wireless headset may transmit signals to and/or receive signals from another device (e.g., a laptop computer, a game console, a smartphone, etc.).

However, particular challenges arise in wireless communications. For example, a blocker signal may interfere with a wanted signal at a wireless communication device. To mitigate this interference, a wireless communication device may provide a blocker margin to sense and filter a blocker signal. As can be observed from this discussion, systems and methods for blocker margin sizing that improves wireless communications may be beneficial.

SUMMARY

A method for dynamic sizing of a blocker margin by a receiver automatic gain control (AGC) is described. The method includes measuring a wanted signal level and a blocker signal level. The method also includes adjusting a linear target for the wanted signal level at the output of an analog-to-digital converter (ADC) of the receiver based on the blocker signal level. The linear target is adjusted to optimize a wanted signal signal-to-noise ratio (SNR) and the blocker margin. The method further includes adjusting a receiver front-end gain based on the adjusted linear target.

The blocker margin may be the amount of the ADC dynamic range that remains after accounting for the wanted signal SNR. When a blocker signal level is detected, the linear target may be adjusted to provide more blocker margin while ensuring a sufficient wanted signal SNR at the output of the ADC.

Adjusting the linear target may include selecting the linear target from among different linear targets based on the measured blocker signal level. Each of the different linear targets may correspond to different blocker signal levels. The linear target may be adjusted to provide a larger blocker margin when a strong blocker signal level is detected as compared to a weak blocker signal level.

The linear target may be adjusted from an initial linear target corresponding to no blocker signal level. The linear target may designate the receiver front-end gain to apply for a given wanted signal level measurement. The wanted signal level may have a linear relationship with the receiver front-end gain such that the linear target remains constant for any wanted signal level within a linear target region.

The dynamic sizing of the blocker margin may occur upon receiving a data packet. The wanted signal level and the blocker signal level may be measured in-band in a digital subsystem.

A wireless communication device for dynamic sizing of a blocker margin is also described. The wireless communication device includes a processor, a memory in electronic communication with the processor, and instructions stored in the memory. The instructions are executable by the processor to measure a wanted signal level and a blocker signal level. The instructions are also executable to adjust a linear target for the wanted signal level at the output of an ADC of the receiver based on the blocker signal level. The linear target is adjusted to optimize a wanted signal SNR and the blocker margin. The instructions are further executable to adjust a receiver front-end gain based on the adjusted linear target.

An apparatus for dynamic sizing of a blocker margin is also described. The apparatus includes means for measuring a wanted signal level and a blocker signal level. The apparatus also includes means for adjusting a linear target for the wanted signal level at the output of an ADC of the receiver based on the blocker signal level. The linear target is adjusted to optimize a wanted SNR and the blocker margin. The apparatus further includes means for adjusting a receiver front-end gain based on the adjusted linear target.

A computer-program product for dynamic sizing of a blocker margin is also described. The computer-program product includes a non-transitory computer-readable medium having instructions thereon. The instructions include code for causing a wireless communication device to measure a wanted signal level and a blocker signal level. The instructions also include code for causing the wireless communication device to adjust a linear target for the wanted signal level at the output of an ADC of the receiver based on the blocker signal level. The linear target is adjusted to optimize a wanted signal SNR and the blocker margin. The instructions further include code for causing the wireless communication device to adjust a receiver front-end gain based on the adjusted linear target.

DETAILED DESCRIPTION

Figure 1:
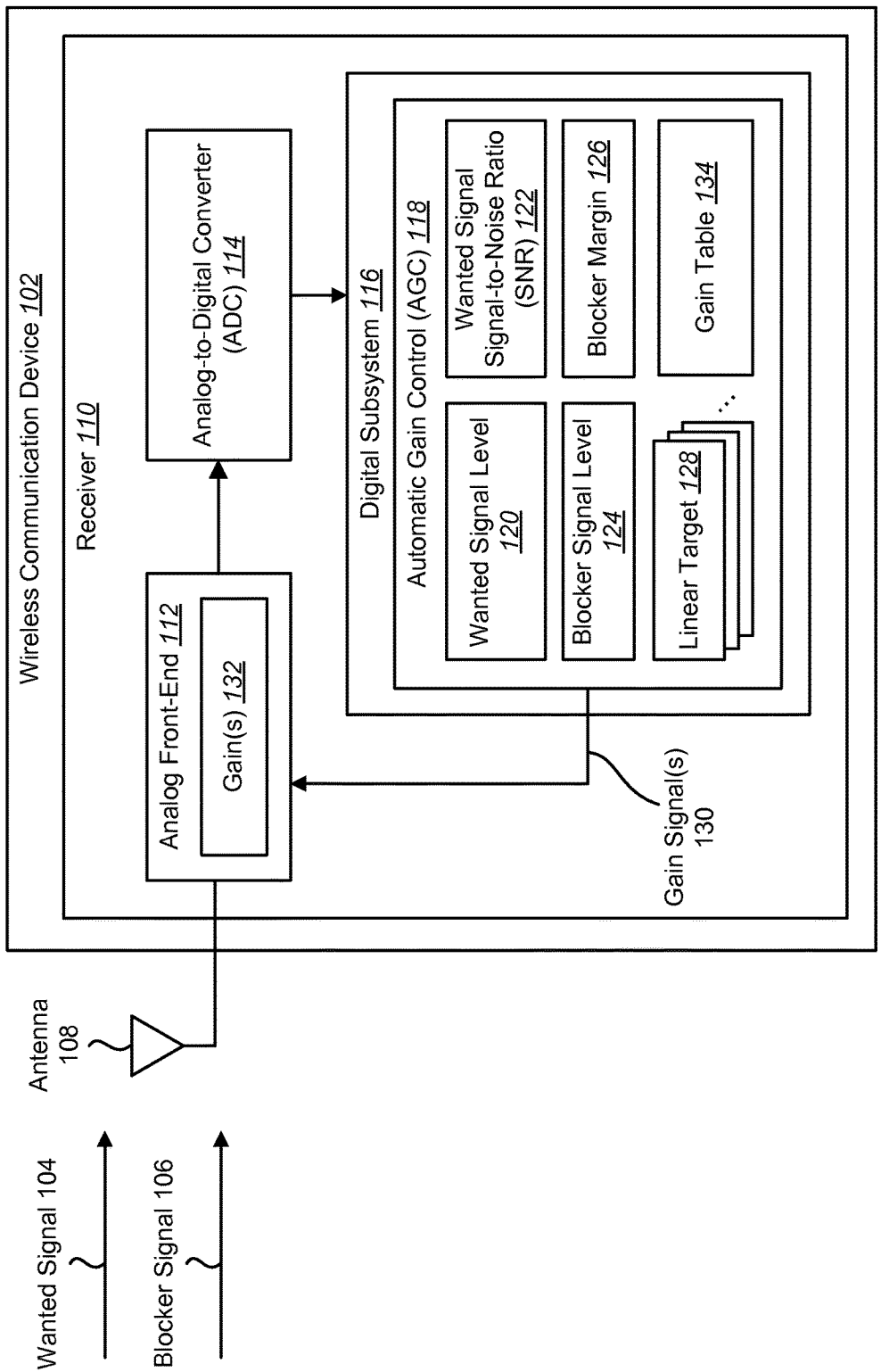
FIG. 1 is a block diagram illustrating one configuration of a wireless communication device for dynamic sizing of a blocker margin.

A receiver (e.g., a Bluetooth receiver) may benefit from supporting a higher blocker margin for normal operations. A blocker signal is a signal that interferes with a wanted signal. Blocker signals can be other Bluetooth signals or WLAN (in the case of coexistence). In one approach, blocker interference can be mitigated by increasing the dynamic range of an analog front-end radio design, but this comes at a cost in power and area.

The front-end gain is an expensive (in terms of area and power) aspect of a receiver. An automatic gain control (AGC) may be used to reduce the size of the analog front-end by selecting the right gains. A challenge with the AGC is to size the signal properly to have enough SNR for the wanted signal. Another constraint is to leave enough headroom for a blocker margin (on top of the SNR requirement).

Traditionally, an AGC may size the received signal based on the wanted signal received signal strength indicator (RSSI) or might have a blocker detector (also referred to as a jammer detector) to give a fixed blocker margin. According to the systems and methods herein, the level of the blocker signal (also referred to as a jammer signal) may also be used to determine an optimal front-end gain to provide the best blocker margin and keep enough SNR at the output of the analog-to-digital (ADC).

The detailed description set forth below in connection with the appended drawings is intended as a description of exemplary implementations of the disclosure and is not intended to represent the only implementations in which the disclosure may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations of the disclosure. In some instances, some devices are shown in block diagram form.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Various configurations are now described with reference to the Figures, where like reference numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

FIG. 1 is a block diagram illustrating one configuration of a wireless communication device 102 for dynamic sizing of a blocker margin 126. Examples of the wireless communication device 102 include cameras, video camcorders, digital cameras, cellular phones, smart phones, computers (e.g., desktop computers, laptop computers, etc.), tablet devices, media players, televisions, automobiles, robots, healthcare equipment, gaming consoles, personal digital assistants (PDAs), set-top boxes, etc. The wireless communication device 102 may include one or more components or elements. One or more of the components or elements may be implemented in hardware (e.g., circuitry) or a combination of hardware and software (e.g., a processor with instructions).

Some wireless communication devices 102 may utilize multiple communication technologies. For example, one communication technology may be utilized for mobile wireless system (MWS) (e.g., cellular) communications, while another communication technology may be utilized for wireless connectivity (WCN) communications. MWS may refer to larger wireless networks (e.g., wireless wide area networks (WWANs), cellular phone networks, Long Term Evolution (LTE) networks, Global System for Mobile Communications (GSM) networks, code division multiple access (CDMA) networks, CDMA2000 networks, wideband CDMA (W-CDMA) networks, Universal mobile Telecommunications System (UMTS) networks, Worldwide Interoperability for Microwave Access (WiMAX) networks, etc.). WCN may refer to relatively smaller wireless networks (e.g., wireless local area networks (WLANs), wireless personal area networks (WPANs), IEEE 802.11 (Wi-Fi) networks, Bluetooth (BT) networks, wireless Universal Serial Bus (USB) networks, etc.).

The terms "networks" and "systems" are often used interchangeably. A CDMA network may implement a radio technology such as Universal Terrestrial Radio Access (UTRA), cdma2000, etc. UTRA includes W-CDMA and Low Chip Rate (LCR) while cdma2000 covers IS-2000, IS-95, and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDMA, etc. UTRA, E-UTRA, and GSM are part of Universal Mobile Telecommunication System (UMTS). Long Term Evolution (LTE) is a release of UMTS that uses E-UTRA. UTRA, E-UTRA, GSM, UMTS, and LTE are described in documents from an organization named "3rd Generation Partnership Project" (3GPP). cdma2000 is described in documents from an organization named "3rd Generation Partnership Project 2" (3GPP2).

The $3^{rd}$ Generation Partnership Project (3GPP) is a collaboration between groups of telecommunications associations that aims to define a globally applicable $3^{rd}$ generation (3G) mobile phone specification. 3GPP Long Term Evolution (LTE) is a 3GPP project aimed at improving the Universal Mobile Telecommunications System (UMTS) mobile phone standard. The 3GPP may define specifications for the next generation of mobile networks, mobile systems, and mobile devices.

The wireless communication device 102 may include an antenna 108 and a receiver 110. The antenna 108 may receive radio frequency (RF) signals. These RF signals may include a wanted signal 104 and a blocker signal 106.

A signal (e.g., a wanted signal 104) may be received by the antenna 108 and provided to an analog front-end 112 for signal conditioning. The analog front-end 112 may also be referred to as an RF front-end. In an example, the analog front-end 112 may include one or more of an impedance matching circuit, a band-pass filter (BPF), an RF amplifier (e.g., low-noise amplifier), a local oscillator (LO) and a mixer. The received signal may be mixed by the mixer to in-phase (I) and quadrature (Q) components near baseband, and then digitized.

The analog front-end 112 may provide an intermediate frequency to an analog-to-digital converter (ADC) 114, which digitizes the signal. An ADC 114 may be characterized by its bandwidth (e.g., the range of frequencies it can measure) and its signal-to-noise ratio (SNR). As used herein, SNR indicates the accuracy of a measured signal relative to background noise.

The digitized signal may be provided to the digital subsystem 116 for further processing (e.g., IF filtering, demodulation, decoding, etc.). The digital subsystem 116 may include digital filters, a modem, and/or a digital signal processor (DSP). Channelization filtering, DC offset rejection, timing alignment, frequency estimation, symbol detection and other digital operations may be performed on the digitized samples.

The wireless communication device 102 may receive a wanted signal 104. A wanted signal 104 is a signal that is desired for processing by the receiver 110. For example, in the case of a Bluetooth receiver, the wanted signal 104 may be a Bluetooth signal.

A blocker signal 106 is an undesired or unexpected signal other than the wanted signal 104. The blocker signal 106 may also be referred to as a blocker or a jamming signal. The blocker signal 106 may have a frequency that is close to the wanted signal 104 such that the blocker signal 106 is not filtered out by analog front-end 112 of the receiver 110. The blocker signal 106 may cause noise or interference with the wanted signal 104.

In one case, the blocker signal 106 may be the same communication technology as the wanted signal 106. In the example of a Bluetooth receiver 110, the blocker signal 106 may be another Bluetooth signal. In the case of coexistence where the wireless communication device 102 communicates using multiple communication technologies (e.g., Bluetooth and WLAN), the blocker signal 106 may be from a technology other than that of the wanted signal 104 (e.g., WLAN). In yet another case, the blocker signal 106 may be a harmonic of a transmitted signal, where the harmonic frequency is near the wanted signal frequency.

In one scenario, the blocker signal 106 may be transmitted from a remote device. In another scenario, the blocker signal 106 may be transmitted by the wireless communication device 102 itself. For example, in coexistence, the wireless communication device 102 may transmit a WLAN signal that is near in frequency to a wanted Bluetooth signal. This WLAN signal may be received by the Bluetooth receiver, thus causing interference.

A receiver 110 should accommodate a high blocker signal 106 for normal operations. In one approach, the effects of the blocker signal 106 may be mitigated by increasing the dynamic range of the analog front-end 112 and the ADC 114. However, this approach comes at the cost of power and size. The front-end gain is an expensive aspect of a receiver 110 in terms of power and size.

The digital subsystem 116 may include an automatic gain control (AGC) 118. The gain of the receiver 110 may be dynamically adjusted based upon the initially detected wanted signal level 120. The AGC 118 may perform the dynamic gain adjustment so that the wanted signal 104 lies inside the dynamic range of the receiver 110 and so that sufficient headroom is left so that a blocker signal 106, either coincident with or later than the wanted signal 104, will not saturate the receiver 110.

The AGC 118 may reduce the size of the analog front-end 112 by selecting the correct gains 132. The challenge with the AGC 118 is to be able to size the wanted signal 104 properly to have enough wanted signal SNR 122. Another constraint is to leave enough headroom for a blocker margin 126 (on top of the SNR requirement). As used herein, the blocker margin 126 is the amount of the ADC dynamic range that remains after accounting for the wanted signal SNR 122.

In an approach, an AGC 118 may adjust the gains 132 analog front-end 112 based on the detection of a blocker signal 106. In this approach, one set of gains 132 may be used when no blocker signal 106 is detected and another set of gains 132 may be used when a blocker signal 106 is detected. This approach results in a fixed blocker margin 126. However, this approach does not consider the blocker signal level 124 when adjusting the gains 132. For example, this approach does not take into account whether the blocker signal 106 is strong or weak. This may result in inaccurate sizing of the blocker margin 126. Benefits are realized by considering the blocker signal level 124 when adjusting the gains 132 of the analog front-end 112.

According to the systems and methods described herein, the AGC 118 may use the blocker signal level 124 to determine an optimal front-end gain 132 to produce the best blocker margin 126 and keep enough wanted signal SNR 122 at the output of the ADC 114.

The AGC 118 may measure the wanted signal level 120 and the blocker signal level 124. For example, the AGC 118 may measure the received signal strength indicator (RSSI) of the wanted signal level 120 and the RSSI of the blocker signal level 124. The wanted signal level 120 and the blocker signal level 124 may be measured in-band in the digital subsystem 116.

The AGC 118 may adjust a linear target 128 for the wanted signal level 120 at the output of the ADC 114 based on the blocker signal level 124. As used herein, a linear target 128 is a desired level for the wanted signal 104 at the output of the ADC 114. The term "linear" refers to the range in which the RF gain 132 will leave enough space for the blocker signal 106. An example of the relationship of the linear target 128 to the wanted signal SNR 122 and the blocker margin 126 is described in connection with FIG. 3. An example of the linear slope of the gain 132 is described in connection with FIG. 4.

The linear target 128 for the wanted signal level 120 may be achieved by adjusting the receiver front-end gain 132 based on the measured wanted signal level 120. After adjusting the receiver front-end gain 132, the wanted signal level 120 at the output of the ADC 114 may be at the linear target 128. The linear target 128 may be measured in decibels relative to full scale (dBFS), where 0 dBFS is the maximum possible digital level for the receiver 110.

While the wanted signal level 120 is within a linear target region, the front-end gain 132 may have a linear relationship with the measured signal level 120. For any given wanted signal level 120 in the linear target region, the front-end gain 132 may be adjusted linearly to shift the wanted signal level 120 at the output of the ADC 114 to the linear target 128. Because the wanted signal level 120 has a linear relationship with the receiver front-end gain 132 within the linear target region, the linear target 128 remains constant for any wanted signal level 120 within the linear target region. In case there is a blocker signal 106, it is beneficial to stay in the linear region. Additional details on the relationship of the wanted signal level 120, front-end gain 132 and linear target 128 are described in connection with FIG. 4.

The linear target 128 may be adjusted to optimize the wanted signal SNR 122 and the blocker margin 126 based on the blocker signal level 124. As the linear target 128 is decreased (i.e., the wanted signal level 120 at the output of the ADC 114 is decreased), the amount of dynamic range available for the wanted signal SNR 122 decreases while the blocker margin 126 increases.

In an example, the ADC dynamic range may be from 0 dBFS to −60 dBFS (at output of ADC 114). The quantization noise is at −60 dBFS in this case and saturation happens at 0 dBFS. The AGC 118 may set a linear target 128 that represents the wanted signal level 120 at output of ADC in dBFS. For example, the linear target may be set to −20 dBFS and this will provide 40 dB of wanted signal SNR 122 and at least 20 dB of blocker margin 126.

When a blocker signal level 124 is detected, the AGC 118 may adjust the linear target 128 to provide more blocker margin 126 while ensuring a sufficient wanted signal SNR 122 at the output of the ADC 114. The linear target 128 may be adjusted to provide a larger blocker margin 126 when a strong blocker signal level 124 is detected as compared to a weak blocker signal level 124.

The linear target 128 adjustment may include selecting the linear target 128 from among different linear targets 128 based on the measured blocker signal level 124. Each of the different linear targets 128 may correspond to different blocker signal levels 124.

In an implementation, three different linear targets 128 may be used. A default linear target 128 may be used when no blocker signal level 124 is detected. In this case, the wanted signal SNR 122 may be maximized and the blocker margin 126 minimized. For a weak blocker signal level 124, a weak blocker linear target 128 may be used that increases the blocker margin 126 while decreasing the wanted signal SNR 122. For a strong blocker signal level 124, a strong blocker linear target 128 may be used that further increases the blocker margin 126 while further decreasing the wanted signal SNR 122. While this example describes three linear targets 128, this may be generalized to any number of linear targets 128 corresponding to different blocker signal levels 124.

In an example of this implementation, the dynamic range is from 0 dBFS to −60 dBFS and the default linear target 128 may be −35 dBFS. This provides 25 dB for the wanted signal SNR 122 and 35 dB for the blocker margin 126. The AGC 118 may use this default linear target 128 when no blocker signal level 124 is detected. For a weak blocker signal level 124, the AGC 118 may select a linear target 128 of −40 dBFS, which provides 20 dB for the wanted signal SNR 122 and 40 dB for the blocker margin 126. For a strong blocker signal level 124, the AGC 118 may select a linear target 128 of −46 dBFS, which provides 14 dB for the wanted signal SNR 122 and 46 dB for the blocker margin 126.

A minimum wanted signal SNR 122 may be maintained. For example, Bluetooth specifications require at least a 14 dB SNR for the wanted signal 104. Therefore, when sizing the blocker margin 126 for a very strong blocker signal level 124, the minimum wanted signal SNR 122 may be reserved and the remaining dynamic range may be used for the blocker margin 126.

It may not be desirable to keep the wanted signal SNR 122 at the minimum. For example, there may not be enough wanted signal SNR 122 for the receiver 110 to operate in error-free mode. Therefore, when there is no blocker signal 106, or a very weak blocker signal 106, the AGC 118 may select a linear target 328 that provides a higher wanted signal SNR 122.

The AGC 118 may adjust the front-end gain 132 based on the adjusted linear target 128. The "active" elements for gain adjustment may include one or more amplifiers (e.g., LNA) and/or analog filters. Each of these components has a configurable gain (as set with digital signal lines). By setting a combination of gain settings for these components, a particular desired overall gain 132 may be achieved. These settings may be organized into a gain table 134, which may include gain settings for particular components of the analog front-end 112 to achieve the desired overall gain 132. For a given wanted signal level measurement, the gain table 134 may provide the gain settings to achieve the overall analog front-end gain 132 that results in the linear target 128. The gain table 134 is where the conversion from how much gain is needed to the actual gain 132 settings in the analog front-end 112.

The gain table 134 may have sets of gain settings corresponding to the different linear targets 128. For example, a first set of gain settings may correspond to a default linear target 128, a second set of gain settings may correspond to a linear target 128 for a weak blocker signal level 124 and a third set of gain settings may correspond to a linear target 128 for a strong blocker signal level 124.

Upon selecting the linear target 128 based on the blocker signal level 124, the AGC 118 may select a set of gain settings in the gain table 134 corresponding to the selected linear target 128. The AGC 118 may then determine the specific gain settings for the measured wanted signal level 120 based on the selected set of gain settings 134. While a single gain table 134 with multiple sets of gain settings has been described, in another implementation, multiple gain tables 134 that correspond to different linear targets 128 may be used.

Upon determining the gain settings, the AGC 118 may send one or more gain signals 130 to the analog-front end 112. The gain signals 130 may indicate the gain settings to apply to the components of the analog front-end 112.

The sizing of the blocker margin 126 may be on a per-packet basis. Upon receiving a data packet in the wanted signal 104, the AGC 118 may perform the blocker margin sizing as described herein. In other words, at the beginning of each packet, the AGC 118 may measure the wanted signal level 120 and the blocker signal level 124 to determine the linear target 128. The AGC 118 may then apply the gain 132 for the duration of the packet. For the next packet, the AGC 118 may reset the linear target 128 to a default linear target 128 and perform the blocker margin sizing again.

In another implementation, the sizing of the blocker margin 126 may occur in a scanning mode. In this case, the linear target 128 can either increase or decrease from a default linear target 128. In other words, the gain 132 can go both directions when in scanning mode.

It should be noted that the AGC 118 may size the wanted signal 104 based on its RSSI. But the AGC 118 also monitors and measures the level 124 of the blocker signal 106 to achieve more accurate sizing and provides more blocker margin 126, if required. This may improve receiver performance, especially in noisy environments where one or more blocker signals 106 interfere with the wanted signal 104.

Figure 2:
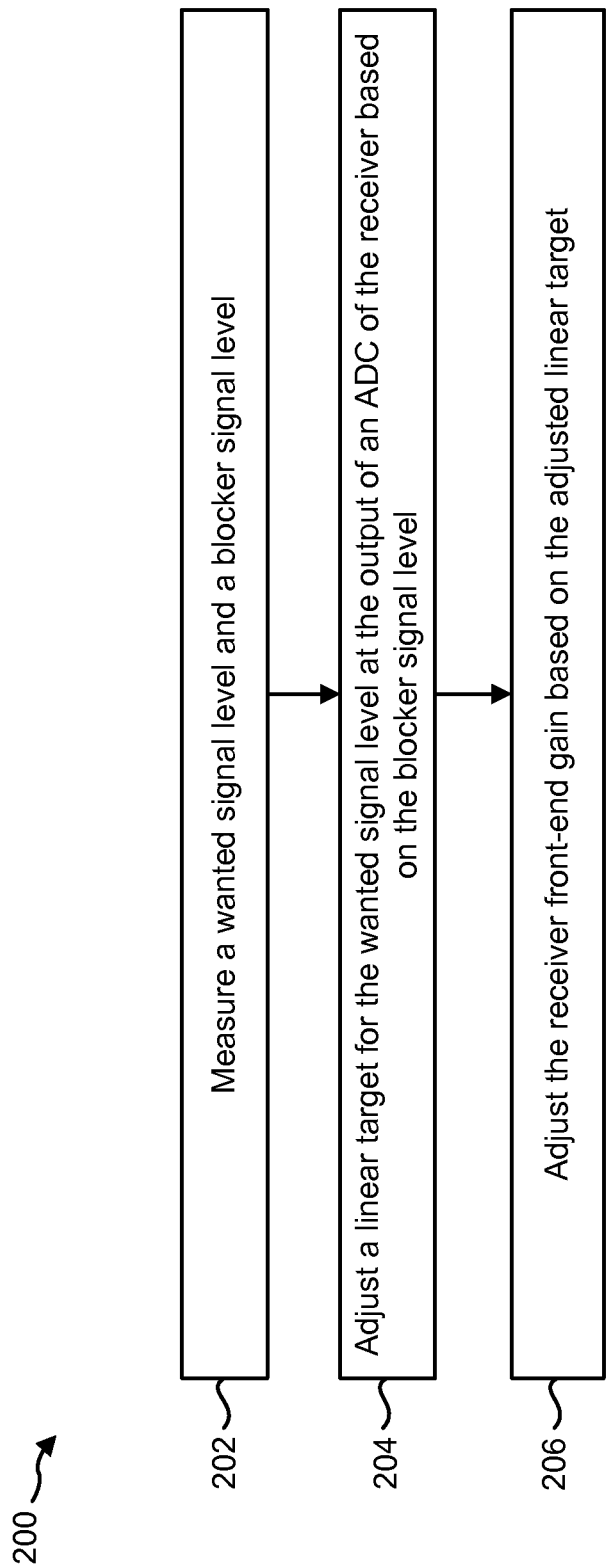
FIG. 2 is a flow diagram illustrating a method for dynamic sizing of a blocker margin.

FIG. 2 is a flow diagram illustrating a method 200 for dynamic sizing of a blocker margin 126. The method 200 may be performed by an automatic gain control (AGC) 118 of a receiver 110. The receiver 110 may receive a wanted signal 104 and a blocker signal 106. The receiver 110 may convert the received signals to digital signals at an analog-to-digital converter (ADC) 114.

The AGC 118 may measure 202 the wanted signal level 120 and the blocker signal level 124. For example, the AGC 118 may measure the RSSI of the wanted signal level 120 and the blocker signal level 124. The wanted signal level 120 and the blocker signal level 124 may be measured in-band in the digital subsystem 116.

The AGC 118 may adjust 204 a linear target 128 for the wanted signal level 120 at the output of the ADC 114 of the receiver 110 based on the blocker signal level 124. The linear target 128 may be adjusted to optimize the wanted signal SNR 122 and the blocker margin 126 based on the blocker signal level 124. In an implementation, as the linear target 128 is decreased (i.e., the wanted signal level 120 at the output of the ADC 114 is decreased), the amount of dynamic range available for the wanted signal SNR 122 decreases and the blocker margin 126 increases.

When a blocker signal level 124 is detected, the AGC 118 may adjust 204 the linear target 128 to provide more blocker margin 126 while ensuring a sufficient wanted signal SNR 122 at the output of the ADC 114. The linear target 128 may be adjusted 204 to provide a larger blocker margin 126 when a strong blocker signal level 124 is detected as compared to a weak blocker signal level 124.

The AGC 118 may adjust 206 the receiver front-end gain 132 based on the adjusted linear target 128. The linear target 128 may designate the receiver front-end gain 132 to apply for a given wanted signal level measurement. The active components for front-end gain 132 adjustment (e.g., analog amplifiers and filters) may each have a configurable gain. A combination of the gains of each component may result in a particular overall gain 132 for the analog front-end 112.

One or more gain signals 130 may be sent to the configurable components to adjust 206 the overall gain 132 of the receiver 110. In an implementation, these settings may be organized into a gain table 134, which may include gain settings for the particular components of the analog front-end 112 to achieve the desired overall gain 132. For a given wanted signal level measurement, the gain table 134 may provide the gain settings to achieve the overall analog front-end gain 132 that results in the linear target 128.

The gain table 134 may have sets of gain settings corresponding to the different linear targets 128. Upon determining the gain settings, the AGC 118 may send one or more gain signals 130 to the analog-front end 112. The gain signals 130 may indicate the gain settings to apply to the components of the analog front-end 112.

Figure 3:
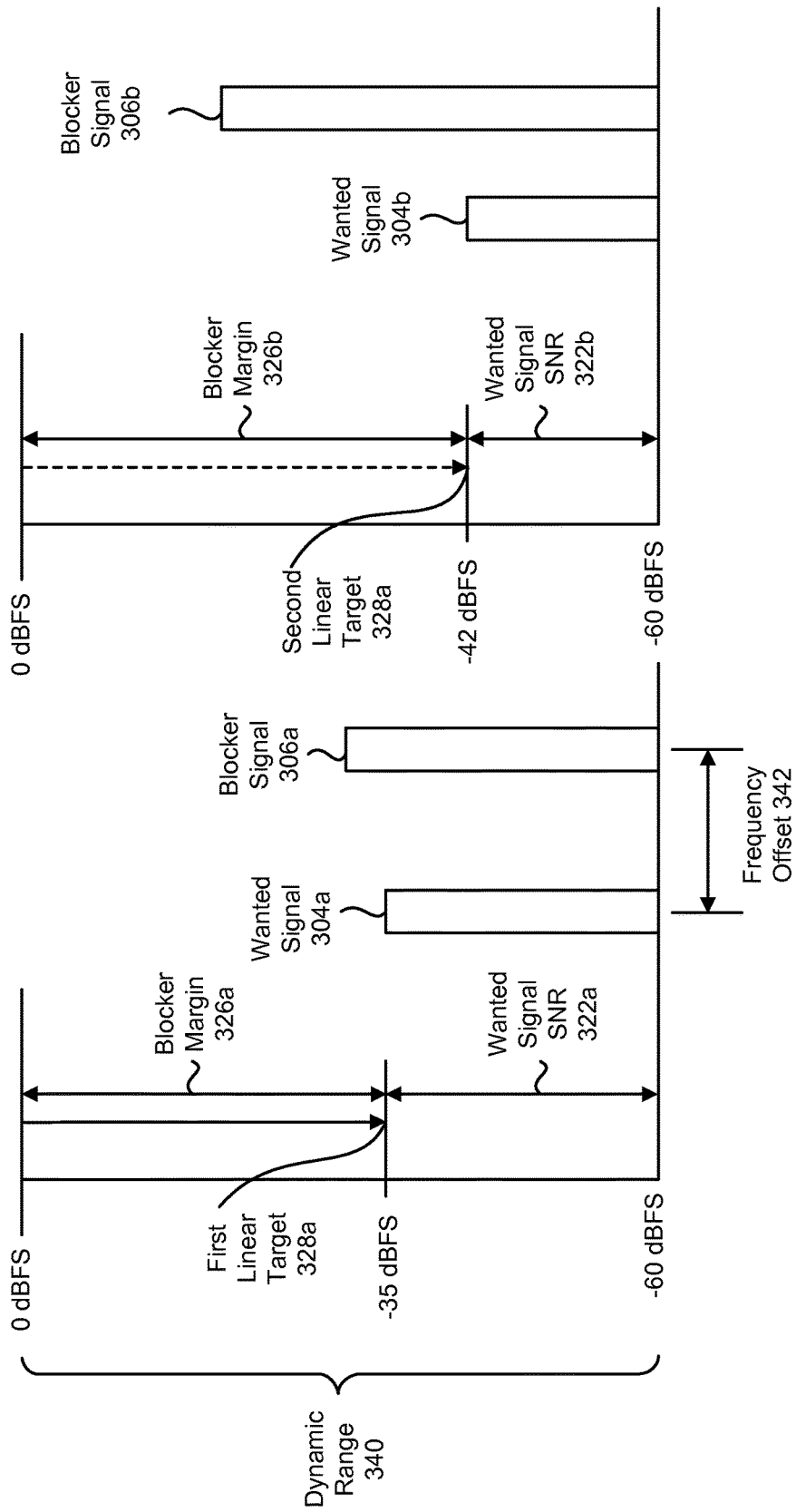
FIG. 3 is an example illustrating the relationship of a linear target, a wanted signal signal-to-noise ratio (SNR) and a blocker margin.

FIG. 3 is an example illustrating the relationship of a linear target 328, a wanted signal SNR 322 and a blocker margin 326. The frequency of a wanted signal 304 and a blocker signal 306 is shown in relation to the front-end dynamic range 340. The blocker signal 306 may have a frequency offset 342. Due to the characteristics of the analog filtering, certain blocker signal 306 frequencies that are near the wanted signal 304 frequency may be allowed to pass through to the digital subsystem 116.

The linear target 328 is the wanted signal level 120 to achieve at the output of the ADC 114 after adjusting the gain 132 of the analog front-end 112. The wanted signal SNR 322 is a margin of the front-end dynamic range 340 that is reserved to receive the wanted signal 304. The blocker margin 126 is the remaining dynamic range 340 that may be used to provide enough room to allow the blocker signal 306 to get through the analog front-end 112 without saturating the ADC 114. The blocker signal 306 may then be filtered by the digital subsystem 116.

In this example, the front-end dynamic range 340 is 60 dB (from 0 dBFS to −60 dBFS) at the output of the ADC 114, 0 dBFS represents the largest signal level that the receiver 110 can handle without clipping. Quantization noise occurs at −60 dBFS.

In a first example for a wanted signal 304a and blocker signal 306a, the first linear target 328a is −35 dBFS. With this first linear target 328a, the wanted signal SNR 322a is determined by subtracting the dynamic range 340 from the first linear target 328a, which yields 25 dB for the wanted signal SNR 322a. The remaining 35 dB of the dynamic range 346 is available for the blocker margin 326a.

In a second example for a wanted signal 304b and blocker signal 306b, the blocker signal 306b is larger than in the first example. In this example, the second linear target 328b is lowered to −42 dBFS. With this second linear target 328b, the wanted signal SNR 322b is 16 dB and the blocker margin 326b is 42 dB.

It should be noted that as the linear target 328 decreases, the wanted signal SNR 322 also decreases. Simultaneously, as the linear target 328 decreases, the blocker margin 326 increases.

Figure 4:
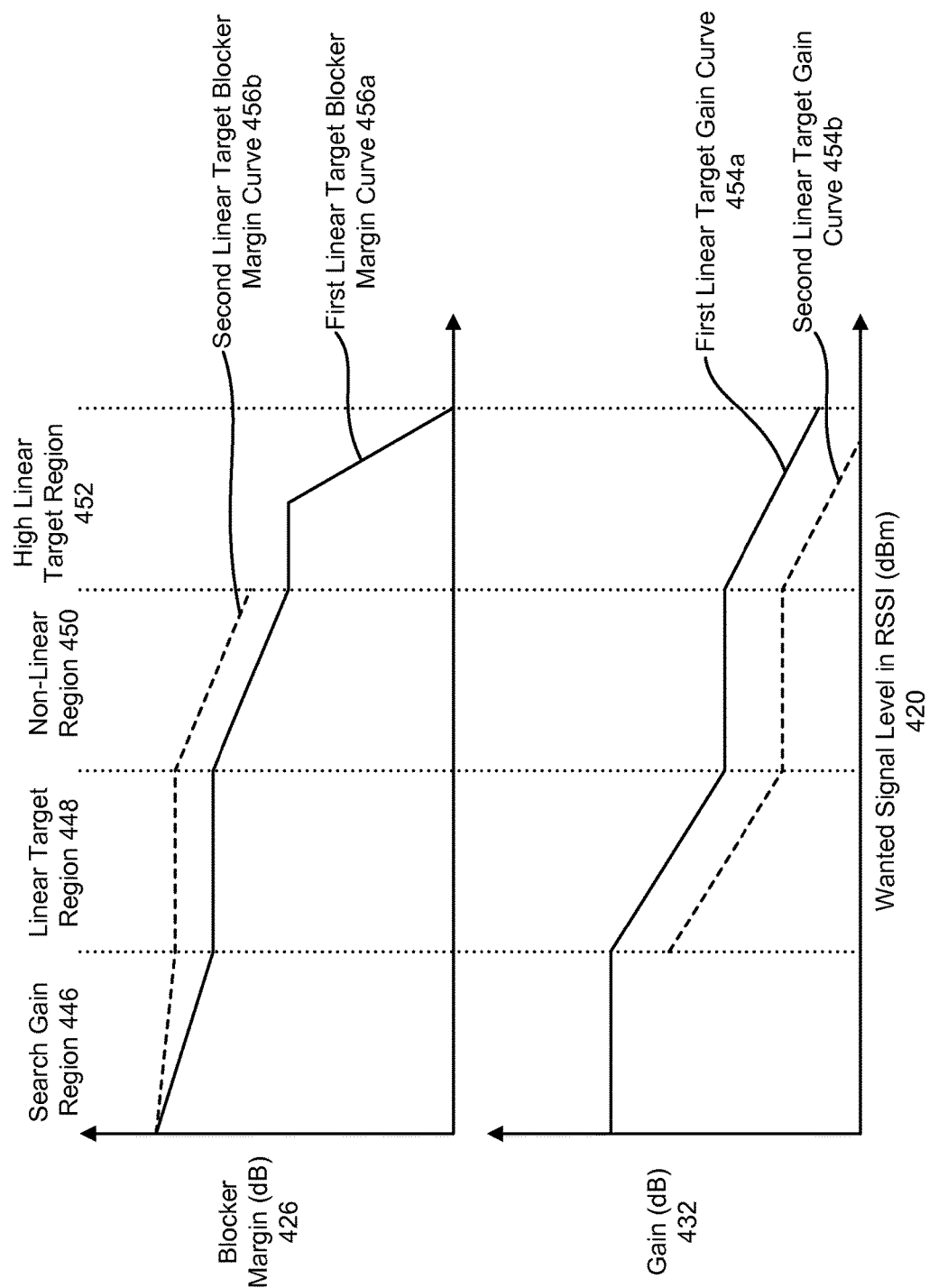
FIG. 4 is an example illustrating the relationship of a receiver front-end gain and a blocker margin relative to a wanted signal level.

FIG. 4 is an example illustrating the relationship of a receiver front-end gain 432 and a blocker margin 426 relative to a wanted signal level 420. In this example, the wanted signal level 420 may be the measured RSSI in dBm. For example, the wanted signal level 420 may be measured in-band by the AGC 118 in the digital subsystem 116.

In an implementation, the wanted signal level 420 may be associated with different regions. The wanted signal level 420 may fall into one of a search gain region 446, a linear target region 448 a non-linear region 450 or a high linear target region 452.

When the wanted signal level 420 is in the search gain region 446, the wanted signal level 420 is weak. In this case, the gain 432 is maximized to ensure sufficient SNR to 122 to receive the wanted signal level 420.

In the linear target region 448, the wanted signal level 420 has a linear relationship with the receiver front-end gain 432 such that the linear target 128 remains constant for any wanted signal level 420 within the linear target region 448. It should be noted that in the linear target region 448, the gain 432 has a linear slope (as opposed to a constant value).

A first linear target gain curve 454a is shown as a solid line. The gain 432 for a wanted signal level 420 corresponding to a first linear target 128 is provided by the first linear target gain curve 454a. In an implementation, this relationship may be represented in a gain table 134, which may include gain settings to achieve the gain 432 for a given wanted signal level 420.

The corresponding blocker margin 426 is shown by the first linear target blocker margin curve 456a. It should be noted that in the linear target region 448, the linear target 128 is constant. Because the blocker margin 426 is inversely proportional to the linear target 128 in the linear target region 448, the blocker margin 426 is also constant in the linear target region 448.

The linear target 128 may be changed. For example, if a blocker signal 106 is detected, the linear target 128 may be decreased. A second linear target gain curve 454b is shown as a dashed line. The gain 432 for a wanted signal level 420 corresponding to a second linear target 128 is provided by the second linear target gain curve 454b. In an implementation, this relationship may be represented in a gain table 134, which may include a second set of gain settings corresponding to the second linear target 128. It should be noted that a decrease in the linear target 128 decreases the gain 432 for a given wanted signal level 420.

The corresponding blocker margin 426 is shown by the second linear target blocker margin curve 456b. Because the blocker margin 426 is inversely proportional to the linear target 128 in the linear target region 448, when the linear target 128 decreases, the blocker margin 426 increases.

Figure 5:
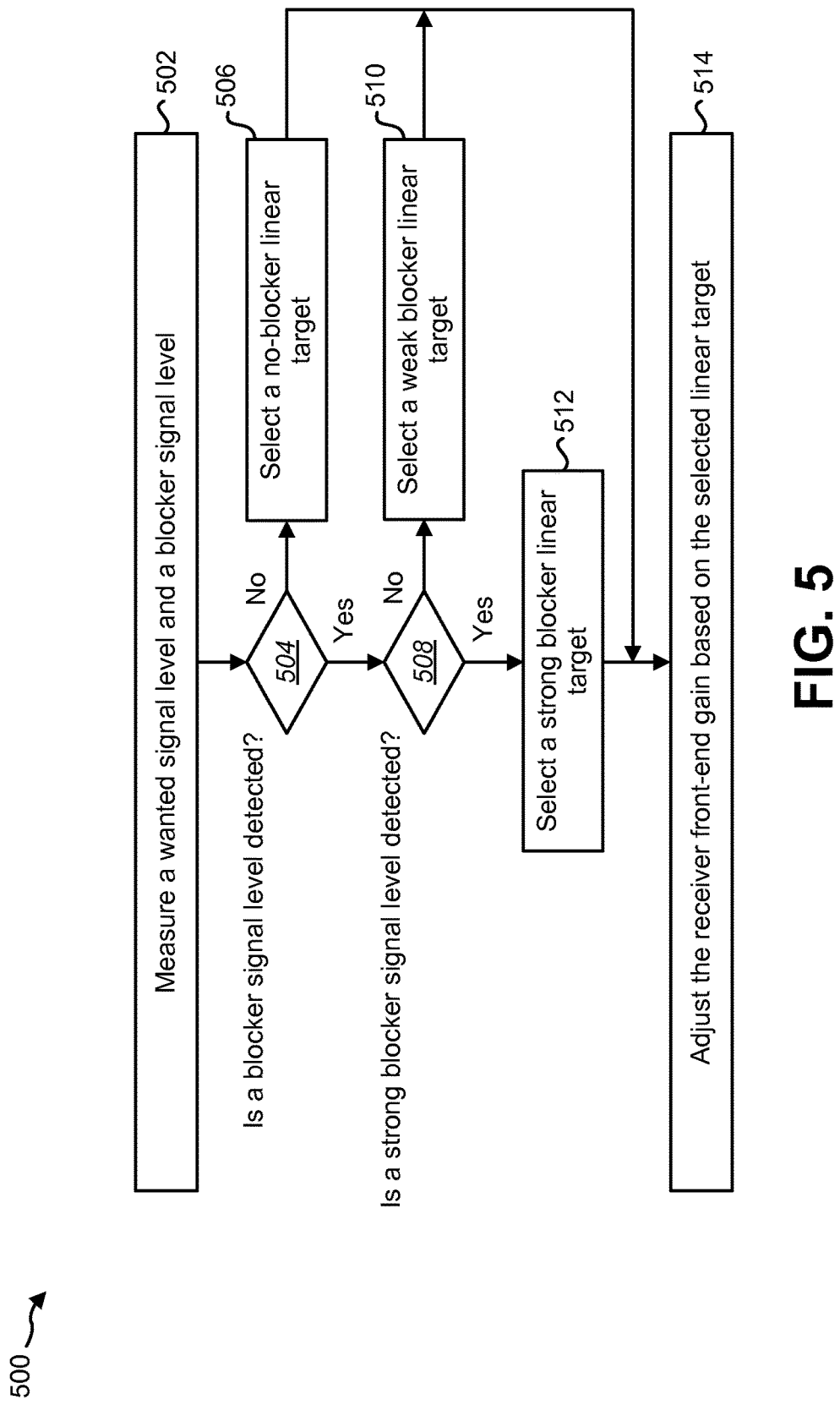
FIG. 5 is a flow diagram illustrating another method for dynamic sizing of a blocker margin.

FIG. 5 is a flow diagram illustrating another method 500 for dynamic sizing of a blocker margin 126. The method 500 may be performed by an AGC 118 of a receiver 110. The receiver 110 may receive a wanted signal 104 and a blocker signal 106. The receiver 110 may convert the received signals to digital signals at an analog-to-digital converter (ADC) 114.

The AGC 118 may measure 502 the wanted signal level 120 and the blocker signal level 124. This may be accomplished as described in connection with FIG. 1. For example, the AGC 118 may measure the RSSI of the wanted signal level 120 and the blocker signal level 124. The wanted signal level 120 and the blocker signal level 124 may be measured in-band in the digital subsystem 116.

When a blocker signal level 124 is detected, the AGC 118 may adjust the linear target 128 to provide more blocker margin 126 while ensuring a sufficient wanted signal SNR 122 at the output of the ADC 114. Conversely, if no blocker signal level 124 is detected, then the AGC 118 may adjust (or maintain) the linear target 128 to provide more wanted signal SNR 122 and less blocker margin 126 at the output of the ADC 114.

The linear target 128 adjustment may include selecting the linear target 128 from among different linear targets 128 based on the measured blocker signal level 124. Each of the different linear targets 128 may correspond to different blocker signal levels 124.

The AGC 118 may determine 504 if a blocker signal level 124 is detected. If there is no blocker signal level 124 detected, or if the measured blocker signal level 124 is below a threshold, then the AGC 118 may select 506 a no-blocker linear target 128. This linear target 128 may be an initial (e.g., default) linear target 128 that may be selected when no blocker signal level 124 is detected. In this case, the wanted signal SNR 122 may be maximized and the blocker margin 126 minimized. The AGC 118 may then adjust 514 the receiver front-end gain 132 based on the selected linear target 128. This may be accomplished as described in connection with FIG. 1.

If the AGC 118 determines 504 that a blocker signal level 124 is detected, then the AGC 118 may determine 508 whether a strong blocker signal level 124 detected. For example, the AGC 118 may determine whether the blocker signal level 124 is greater than a strong blocker threshold. If the blocker signal level 124 is not a strong blocker signal level 124, then the AGC 118 may select 510 a weak blocker linear target 128. The weak blocker linear target 128 may increase the blocker margin 126 while decreasing the wanted signal SNR 122. In this case, the AGC 118 adjusts the linear target 128 from the initial linear target 128 corresponding to no blocker signal level 124. The AGC 118 may then adjust 514 the receiver front-end gain 132 based on the selected linear target 128.

If the AGC 118 determines 508 that a strong blocker signal level 124 detected, then the AGC 118 may select 512 a strong blocker linear target 128. The strong blocker linear target 128 may increase the blocker margin 126 and decrease the wanted signal SNR 122 even more than the weak blocker linear target 128. The AGC 118 may then adjust 514 the receiver front-end gain 132 based on the selected linear target 128.

Figure 6:
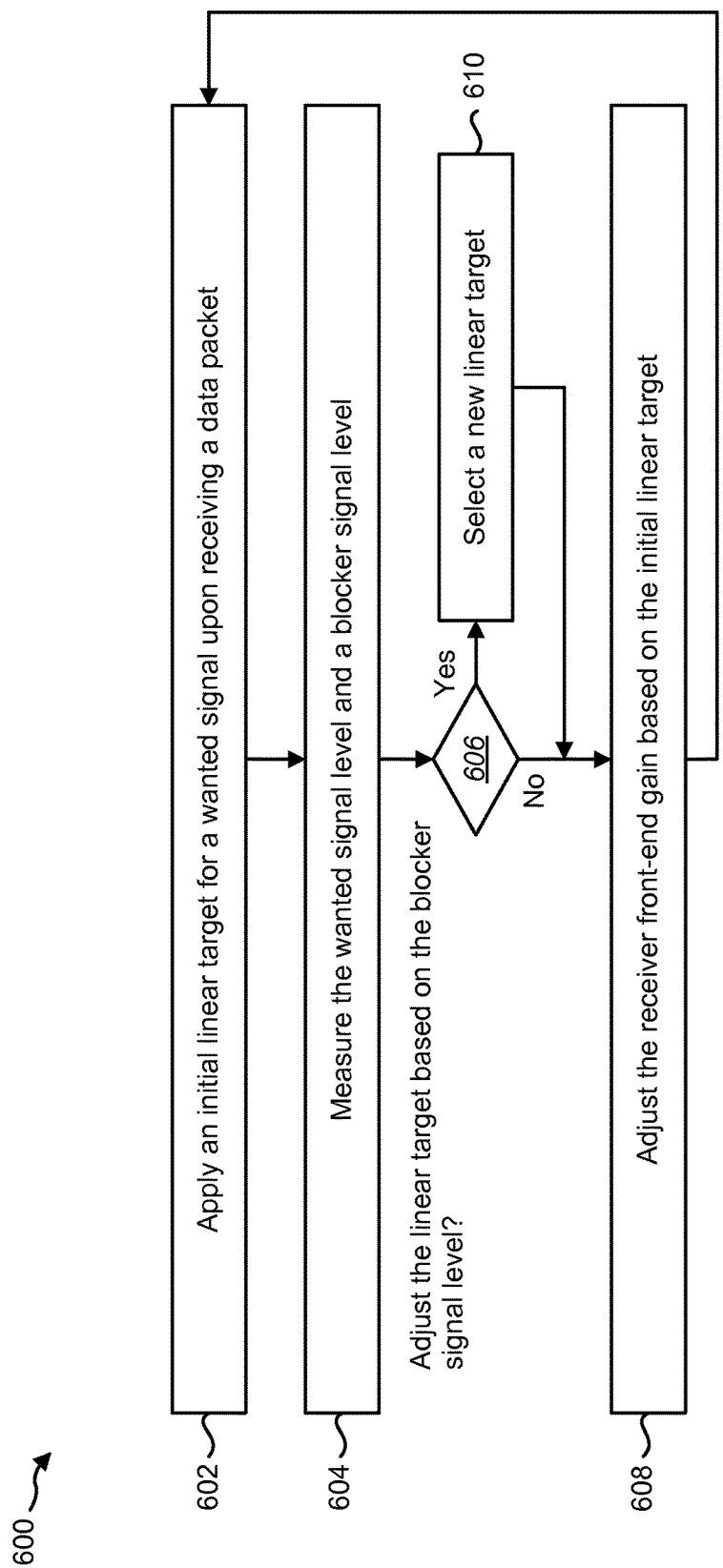
FIG. 6 is a flow diagram illustrating yet another method for dynamic sizing of a blocker margin.

FIG. 6 is a flow diagram illustrating yet another method 600 for dynamic sizing of a blocker margin 126. The method 600 may be performed by an AGC 118 of a receiver 110. The receiver 110 may receive a wanted signal 104 and a blocker signal 106. The receiver 110 may convert the received signals to digital signals at an analog-to-digital converter (ADC) 114. In some scenarios, the wanted signal 104 may include a data packet.

The AGC 118 may apply 602 an initial linear target 128 for the wanted signal level 120 upon receiving a data packet. The initial linear target 128 may be a default linear target 128 that is applied at the beginning of each received data packet. The initial linear target 128 may be based on a no-blocker signal condition. As such, the initial linear target 128 may maximize the wanted signal SNR 122 and minimize the blocker margin 126.

The AGC 118 may measure 604 the wanted signal level 120 and the blocker signal level 124. This may be accomplished as described in connection with FIG. 1.

The AGC 118 may determine 606 whether to adjust the linear target 128 for based on the blocker signal level 124. For example, if no blocker signal level 124 is detected, then the AGC 118 may maintain the initial linear target 128 to maximize wanted signal SNR 122 and minimize the blocker margin 126. The AGC 118 may then adjust 608 the receiver front-end gain 132 based on the initial linear target 128. This may be accomplished as described in connection with FIG. 1.

If a blocker signal level 124 is detected, then the AGC 118 may select 610 a new linear target 128. The linear target 128 selection may be based on the blocker signal level 124. The linear target 128 may be selected to provide more blocker margin 126 while ensuring a sufficient wanted signal SNR 122 at the output of the ADC 114. The AGC 118 may then adjust 608 the receiver front-end gain 132 based on the initial linear target 128. This may be accomplished as described in connection with FIG. 1.

Upon receiving another data packet, the AGC 118 may reset the linear target 128 by applying 602 the initial linear target 128. The AGC 118 may then perform the dynamic sizing of the blocker margin 126 for the new data packet.

Figure 7:
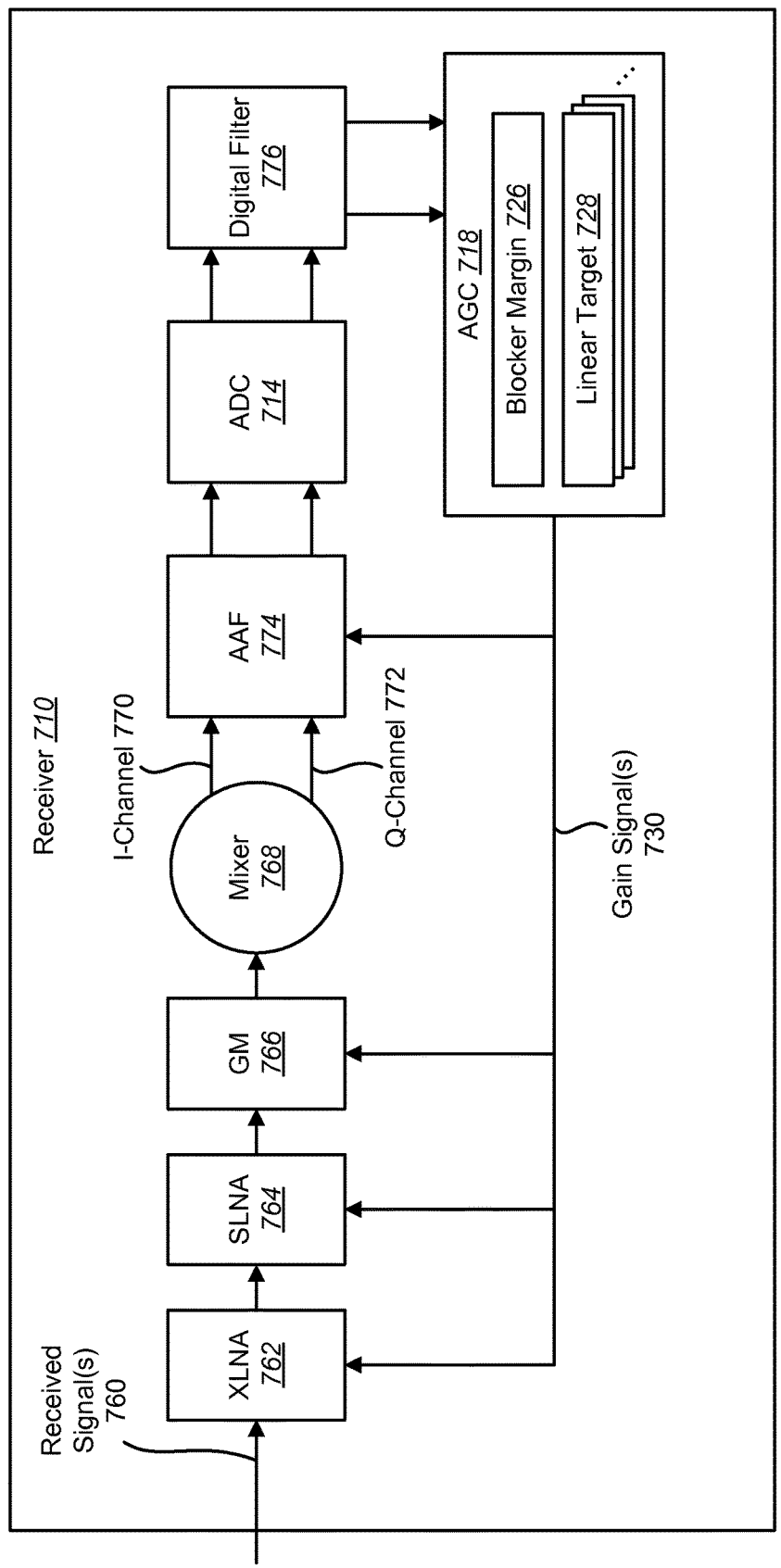
FIG. 7 is a block diagram illustrating one configuration of a receiver configured for dynamic sizing of a blocker margin.

FIG. 7 is a block diagram illustrating one configuration of a receiver 710 for dynamic sizing of a blocker margin 726. The receiver 710 may be implemented in accordance with the receiver 110 described in connection with FIG. 1.

The receiver 710 may receive a signal 760. The received signal 760 may include a wanted signal 104 and/or a blocker signal 106. The received signal 760 may be amplified by an X-band LNA (XLNA) 762, an S-band LNA (SLNA) 764 and transconductance (GM) 766.

The mixer 768 may down-convert the amplified signal to baseband using a local oscillator signal. The down-converted signal may be a DC and baseband signal that includes an I-channel and a Q-channel. An anti-aliasing filter 774 may filter the signal to restrict the bandwidth of the signal.

The ADC 714 may sample the signal to generate a digital signal. This digital signal may be filtered in a digital filter 776. The filtered digital signal may be provided to the AGC 718 to determine gain settings for dynamic sizing of the blocker margin 726. This may be accomplished as described in connection with FIG. 1.

The AGC 718 may measure the in-phase component (e.g., Idc) and the quadrature-phase component (e.g., Qdc) of the digital signal in-band. The AGC 718 may measure the wanted signal level 120 and the blocker signal level 124 in RSSI. Based on the measurements, the AGC 718 may adjust a linear target 728 to optimize the wanted signal SNR 122 and the blocker margin 726.

The AGC 718 may determine the gain settings corresponding to the measured wanted signal level 120 that will achieve the linear target 728. The AGC 718 may send one or more gain signals 730 to at least one of the XLNA 762, the SLNA 764, the GM 766 and the AAF 774 to adjust the overall gain 132 of the receiver 710 such that the wanted signal level 120 at the output of the ADC 714 is adjusted to the selected linear target 728.

Figure 8:
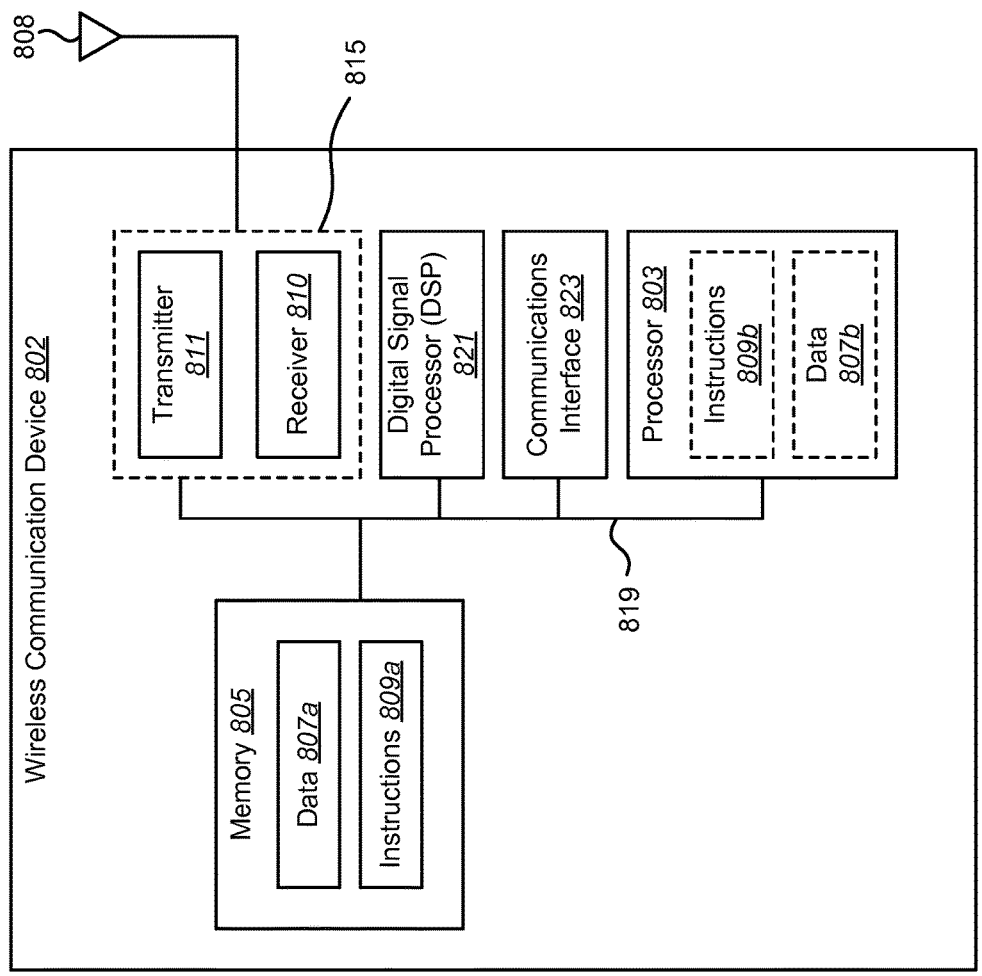
FIG. 8 illustrates certain components that may be included within a wireless communication device.

FIG. 8 illustrates certain components that may be included within a wireless communication device 802. The wireless communication device 802 may be an access terminal, a mobile station, a user equipment (UE), etc. For example, the wireless communication device 802 may be the wireless communication device 102 of FIG. 1.

The wireless communication device 802 includes a processor 803. The processor 803 may be a general purpose single- or multi-chip microprocessor (e.g., an Advanced RISC (Reduced Instruction Set Computer) Machine (ARM)), a special purpose microprocessor (e.g., a digital signal processor (DSP)), a microcontroller, a programmable gate array, etc. The processor 803 may be referred to as a central processing unit (CPU). Although just a single processor 803 is shown in the wireless communication device 802 of FIG. 8, in an alternative configuration, a combination of processors (e.g., an ARM and DSP) could be used.

The wireless communication device 802 also includes memory 805 in electronic communication with the processor (i.e., the processor can read information from and/or write information to the memory). The memory 805 may be any electronic component capable of storing electronic information. The memory 805 may be configured as random access memory (RAM), read-only memory (ROM), magnetic disk storage media, optical storage media, flash memory devices in RAM, on-board memory included with the processor, EPROM memory, EEPROM memory, registers and so forth, including combinations thereof.

Data 807*a* and instructions 809*a* may be stored in the memory 805. The instructions may include one or more programs, routines, sub-routines, functions, procedures, code, etc. The instructions may include a single computer-readable statement or many computer-readable statements. The instructions 809*a* may be executable by the processor 803 to implement the methods disclosed herein. Executing the instructions 809*a* may involve the use of the data 807*a* that is stored in the memory 805. When the processor 803 executes the instructions 809, various portions of the instructions 809*b* may be loaded onto the processor 803, and various pieces of data 807*b* may be loaded onto the processor 803.

The wireless communication device 802 may also include a transmitter 811 and a receiver 810 to allow transmission and reception of signals to and from the wireless communication device 802 via an antenna 808. The transmitter 811 and receiver 810 may be collectively referred to as a transceiver 815. The wireless communication device 802 may also include (not shown) multiple transmitters, multiple antennas, multiple receivers and/or multiple transceivers.

The wireless communication device 802 may include a digital signal processor (DSP) 821. The wireless communication device 802 may also include a communications interface 823. The communications interface 823 may allow a user to interact with the wireless communication device 802.

The various components of the wireless communication device 802 may be coupled together by one or more buses, which may include a power bus, a control signal bus, a status signal bus, a data bus, etc. For the sake of clarity, the various buses are illustrated in FIG. 8 as a bus system 819.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a digital signal processor (DSP) and a microprocessor, a plurality of microprocessors, one or more microprocessors in conjunction with a digital signal processor (DSP) core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 2, and FIGS. 5-6, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for dynamic sizing of a blocker margin by a receiver automatic gain control (AGC), comprising:
   measuring a wanted signal level and a blocker signal level;
   adjusting a linear target for the wanted signal level at an output of an analog-to-digital converter (ADC) of the receiver based on the blocker signal level, wherein the linear target is adjusted to provide a larger blocker margin when a strong blocker signal level is detected as compared to a weak blocker signal level, wherein the linear target is adjusted to optimize a wanted signal signal-to-noise ratio (SNR) and the blocker margin; and
   adjusting a receiver front-end gain based on the adjusted linear target.

2. The method of claim 1, wherein the blocker margin is an amount of ADC dynamic range that remains after accounting for the wanted signal SNR.

3. The method of claim 1, wherein when a blocker signal level is detected, the linear target is adjusted to provide more blocker margin while ensuring a sufficient wanted signal SNR at the output of the ADC.

4. The method of claim 1, wherein adjusting the linear target comprises:
   selecting the linear target from among different linear targets based on the measured blocker signal level, wherein each of the different linear targets correspond to different blocker signal levels.

5. The method of claim 1, wherein the linear target is adjusted from an initial linear target corresponding to no blocker signal level.

6. The method of claim 1, wherein the linear target designates the receiver front-end gain to apply for a given wanted signal level measurement.

7. The method of claim 1, wherein the dynamic sizing of the blocker margin occurs upon receiving a data packet.

8. The method of claim 1, wherein the wanted signal level has a linear relationship with the receiver front-end gain such that the linear target remains constant for any wanted signal level within a linear target region.

9. The method of claim 1, wherein the wanted signal level and the blocker signal level are measured in-band in a digital subsystem.

10. A wireless communication device for dynamic sizing of a blocker margin, comprising:
    a processor;
    a memory in electronic communication with the processor; and
    instructions stored in the memory, the instructions executable by the processor to:
        measure a wanted signal level and a blocker signal level;
        adjust a linear target for the wanted signal level at an output of an analog-to-digital converter (ADC) of a receiver based on the blocker signal level, wherein the linear target is adjusted to provide a larger blocker margin when a strong blocker signal level is detected as compared to a weak blocker signal level, wherein the linear target is adjusted to optimize a wanted signal signal-to-noise ratio (SNR) and the blocker margin; and
        adjust a receiver front-end gain based on the adjusted linear target.

11. The wireless communication device of claim 10, wherein when a blocker signal level is detected, the linear target is adjusted to provide more blocker margin while ensuring a sufficient wanted signal SNR at the output of the ADC.

12. The wireless communication device of claim 10, wherein the instructions executable to adjust the linear target comprise instructions executable to:
    select the linear target from among different linear targets based on the measured blocker signal level, wherein each of the different linear targets correspond to different blocker signal levels.

13. The wireless communication device of claim 10, wherein the linear target is adjusted from an initial linear target corresponding to no blocker signal level.

14. The wireless communication device of claim 10, wherein the linear target designates the receiver front-end gain to apply for a given wanted signal level measurement.

15. The wireless communication device of claim 10, wherein the wanted signal level has a linear relationship with the receiver front-end gain such that the linear target remains constant for any wanted signal level within a linear target region.

16. An apparatus for dynamic sizing of a blocker margin, comprising:
   means for measuring a wanted signal level and a blocker signal level;
   means for adjusting a linear target for the wanted signal level at an output of an analog-to-digital converter (ADC) of a receiver based on the blocker signal level, wherein the linear target is adjusted to provide a larger blocker margin when a strong blocker signal level is detected as compared to a weak blocker signal level, wherein the linear target is adjusted to optimize a wanted signal signal-to-noise ratio (SNR) and the blocker margin; and
   means for adjusting a receiver front-end gain based on the adjusted linear target.

17. The apparatus of claim 16, wherein when a blocker signal level is detected, the linear target is adjusted to provide more blocker margin while ensuring a sufficient wanted signal SNR at the output of the ADC.

18. The apparatus of claim 16, wherein the means for adjusting the linear target comprise:
   means for selecting the linear target from among different linear targets based on the measured blocker signal level, wherein each of the different linear targets correspond to different blocker signal levels.

19. The apparatus of claim 16, wherein the linear target is adjusted from an initial linear target corresponding to no blocker signal level.

20. The apparatus of claim 16, wherein the linear target designates the receiver front-end gain to apply for a given wanted signal level measurement.

21. The apparatus of claim 16, wherein the wanted signal level has a linear relationship with the receiver front-end gain such that the linear target remains constant for any wanted signal level within a linear target region.

22. A computer-program product for dynamic sizing of a blocker margin, the computer-program product comprising a non-transitory computer-readable medium having instructions thereon, the instructions comprising:
   code for causing a wireless communication device to measure a wanted signal level and a blocker signal level;
   code for causing the wireless communication device to adjust a linear target for the wanted signal level at an output of an analog-to-digital converter (ADC) of a receiver based on the blocker signal level, wherein the linear target is adjusted to provide a larger blocker margin when a strong blocker signal level is detected as compared to a weak blocker signal level, wherein the linear target is adjusted to optimize a wanted signal signal-to-noise ratio (SNR) and the blocker margin; and
   code for causing the wireless communication device to adjust a receiver front-end gain based on the adjusted linear target.

23. The computer-program product of claim 22, wherein when a blocker signal level is detected, the linear target is adjusted to provide more blocker margin while ensuring a sufficient wanted signal SNR at the output of the ADC.

24. The computer-program product of claim 22, wherein the code for causing the wireless communication device to adjust the linear target comprises code for causing the wireless communication device to:
   select the linear target from among different linear targets based on the measured blocker signal level, wherein each of the different linear targets correspond to different blocker signal levels.

25. The computer-program product of claim 22, wherein the linear target designates the receiver front-end gain to apply for a given wanted signal level measurement.

26. The computer-program product of claim 22, wherein the wanted signal level has a linear relationship with the receiver front-end gain such that the linear target remains constant for any wanted signal level within a linear target region.

* * * * *